(12) United States Patent
Velez et al.

(10) Patent No.: US 6,289,044 B1
(45) Date of Patent: Sep. 11, 2001

(54) AUTOMATIC GAIN CONTROL CIRCUIT FOR A MODEM RECEIVER

(75) Inventors: Edgar Velez, Kanata; Ian Dublin, Ottawa; Peter Noel, Winchester, all of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/076,635

(22) Filed: May 12, 1998

(51) Int. Cl.[7] ....................................................... H04B 1/38
(52) U.S. Cl. ........................ 375/222; 375/345; 455/234.1; 455/241.1
(58) Field of Search ..................................... 375/219, 222, 375/345; 455/232.1, 234.1, 239.1, 240.1, 241.1, 249.1, 250.1

(56) References Cited

U.S. PATENT DOCUMENTS

| 5,134,631 | * | 7/1992 | Kingston et al. ......................... 375/1 |
| 5,448,595 | | 9/1995 | Kaku et al. ........................... 375/345 |
| 5,452,332 | * | 9/1995 | Otani et al. ........................... 375/345 |
| 5,469,115 | | 11/1995 | Peterzell et al. ...................... 330/129 |
| 5,483,691 | | 1/1996 | Heck et al. ........................ 455/234.2 |
| 5,745,531 | * | 4/1998 | Sawahashi et al. ................... 375/345 |
| 5,758,271 | * | 5/1998 | Rich et al. .......................... 455/234.1 |
| 5,764,689 | * | 7/1998 | Walley ................................ 375/206 |
| 5,784,410 | * | 7/1998 | Nakano ................................ 375/345 |
| 5,917,865 | * | 6/1999 | Kopmeiners et al. ................ 375/345 |
| 5,946,607 | * | 6/1999 | Shiino et al. ...................... 455/234.1 |
| 6,038,435 | * | 3/2000 | Zhang ................................ 455/324.1 |

* cited by examiner

Primary Examiner—Stephen Chin
Assistant Examiner—Dac V. Ha
(74) Attorney, Agent, or Firm—Max R. Wood; Swabey Ogilvy Renault

(57) ABSTRACT

An automatic gain control method and apparatus for modem receivers. The automatic gain control circuit includes a programmable loop gain for scaling a digital signal Y to a first prescribed level during a first mode of operation and to a second prescribed level during a second mode of operation; and filters and converters for converting the scaled signal Y into an analog gain control signal for input to the analog AGC. The gain control circuit and method of operation provides control over the parameters of the programmable loop gain such that during start-up initialization the signal Y is scaled to the first prescribed value and during steady state operation the signal Y is scaled to the second prescribed value. This is accomplished by changing the gain parameter of the programmable loop gain.

17 Claims, 4 Drawing Sheets

AUTOMATIC GAIN CONTROL CIRCUIT FOR A MODEM RECEIVER

FIELD OF THE INVENTION

This invention relates to the field of automatic gain control (AGC) circuits, and more particularly, for AGC circuits of modem receivers.

BACKGROUND OF THE INVENTION

In communication systems a modem is used to convert (modulate) digital signals generated by a computer into analog signals suitable for transmission over telephone lines. Another modem, located at the receiving end of the transmission, converts (demodulates) the analog signals back into digital form. The transmission speed of digital subscriber loop (DSL) modems has exhibited a remarkable increase in recent years, and as the increase of the transmission speed progresses, it becomes increasingly necessary to reduce the occurrence of errors in data communication arising from disturbances of the circuit to as few as possible.

In addition, due to the large range of different twisted pair loops over which high speed modems operate and the varying amount of interference, the received signal at the analog-to-digital converter input (in the demodulation section of a modem) can present a dynamic range of over 70 dB.

An automatic gain control circuit is provided in the demodulation section of a modem to monitor the input signal level and to provide the appropriate gain to bring the signal to a desired level.

Traditional AGC circuits in modem receivers working over the necessary full dynamic range present significant differences in performance, convergence times, and gain variability at different regions of operation.

Consequently, there is a need for a AGC circuit in an modem receiver that provides gain tracking for a large range of twisted pair loops with over 70 dB range (for example), various signal bandwidths, and in the presence of radio frequency (RF) and other asynchronous digital subscriber line (ADSL) interference. Further, the AGC circuit must improve gain ripple after convergence to minimize its noise contribution to the system.

SUMMARY OF THE INVENTION

An object of the present invention is to provide an automatic gain control circuit for a modem receiver that improves gain tracking for a large range of twisted pair loops.

Another object of the present invention is to provide an automatic gain control circuit for a modem receiver that improves gain ripple after modem convergence to minimize noise contribution.

In accordance with an aspect of the present invention there is provided an automatic gain control circuit for a modem receiver, said receiver having an analog automatic gain control (AGC) amplifier to attenuate an input signal X prior to being digitized to a signal Y by an analog-to-digital converter, said automatic gain control circuit comprising: a programmable loop gain for scaling the signal Y to a first prescribed level during a first mode of operation and to a second prescribed level during a second mode of operation; and means for converting the scaled signal Y into an analog gain control signal for input to the analog AGC.

In accordance with another aspect of the present invention there is provided an automatic gain control circuit for a modem receiver, said receiver having an analog automatic gain control (AGC) amplifier to attenuate an input signal X prior to being digitized to a signal Y by an analog-to-digital converter, said automatic gain control circuit comprising: (a) means for obtaining an AGC signal from the signal Y; (b) means for subtracting the AGC signal from a prescribed reference signal to form a delta signal; (c) scaling means for reducing the delta signal by a prescribed value; (d) an integrator for integrating the scaled delta signal to form an AGC level control signal; and (e) conversion means for converting the AGC level control signal to an analog AGC control signal for the analog AGC amplifier to attenuate the input signal X.

In accordance with another aspect of the present invention there is provided an a method of attenuating an input signal X in an automatic gain control circuit of a modem receiver, said receiver having an analog automatic gain control (AGC) amplifier to attenuate the input signal X prior to being digitized to a signal Y by an analog-to-digital converter, the method comprising the steps of: (a) scaling the signal Y to a first prescribed level during a first mode of operation and to a second prescribed level during a second mode of operation; and (b) converting the scaled signal Y into an analog gain control signal for input to the analog AGC.

BRIEF DESCRIPTION OF THE DRAWINGS

The present invention will be described in conjunction with the drawings in which.

DETAILED DESCRIPTION OF EMBODIMENTS OF THE INVENTION

Figure 1:
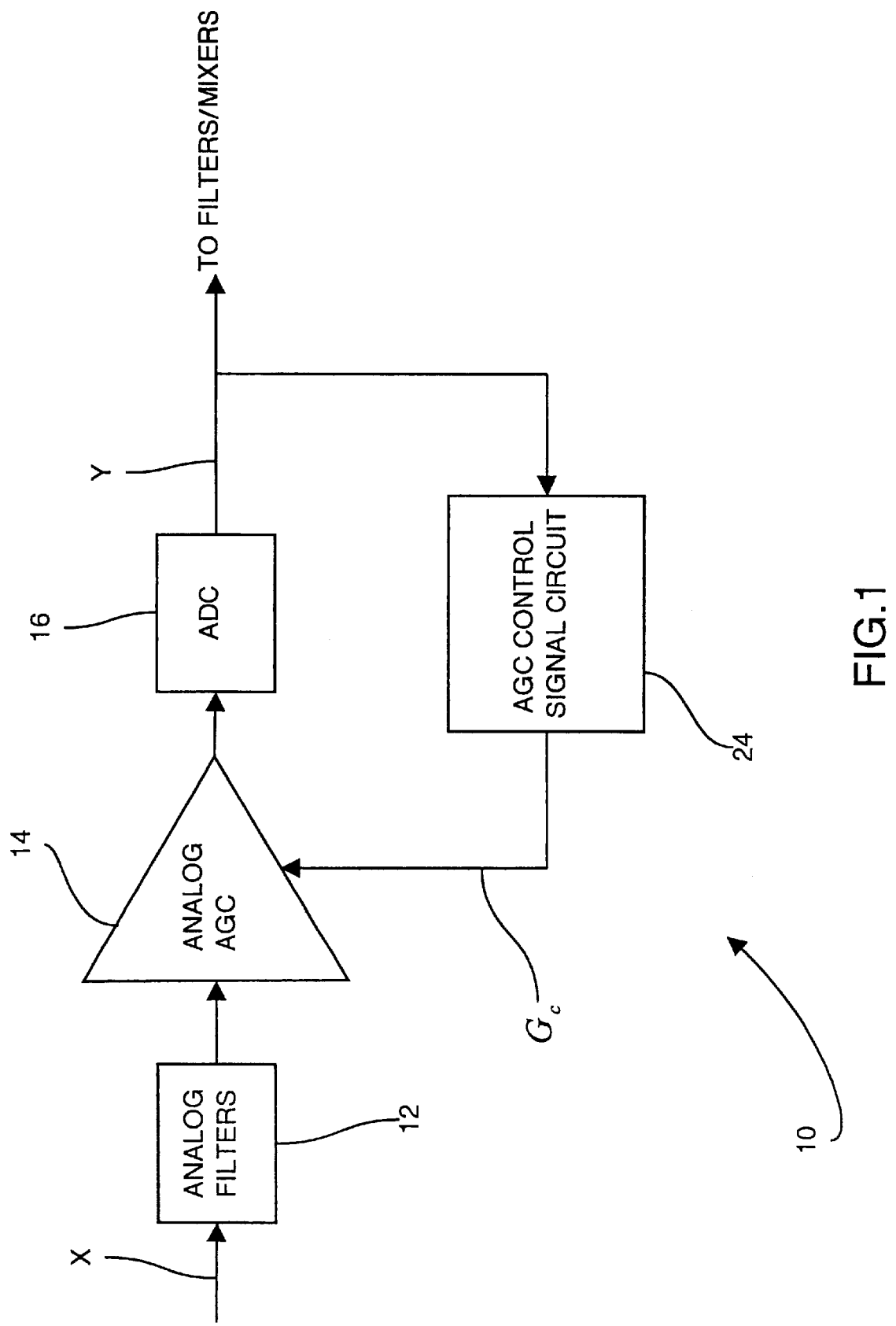
FIG. 1 illustrates a block diagram of a section of a modem receiver.

A portion of a receiver 10 of a modem is illustrated in FIG. 1. An input signal X is processed through analog filters 12 to condition the input signal X. The analog filters 12 reject and attenuate unwanted signals, such as other ADSL signals, feed-through signals from a transmitter through hybrid four-to-two wire interfaces, RF interference (e.g. from AM broadcasts), out-of-band noises, and the like.

The filtered input signal X is then processed through an analog automatic gain control (AGC) amplifier 14 to control the gain of the input signal X. After processing through the analog AGC 14 the signal is digitized by an analog-to-digital converter 16 to produce a digital signal Y.

The digital signal Y is processed by an AGC control signal circuit 24 to produce an analog control signal G, that is provided to the analog AGC 14 to dictate the amount of attenuation/gain required to bring the level of the input signal X to a desired level. Typically, it is desirable for the input signal X to be brought to near the full scale of the ADC 16, so that a majority of the ADC dynamic range can be exploited.

Due to the range of different telecommunications environments in which modems operate and the varying amounts of possible interference, the strength of the input signal X can vary considerably. To regulate the signal strength at the input to the ADC 16 the present invention provides the AGC control signal circuit 24 to provide the control signal $G_c$ to the analog AGC 14 to modulate the gain of the input signal X. Three different implementations 24a, 24b, and 24c of the AGC control signal circuit 24 are described in detail below in conjunction with FIGS. 2 to 4.

Figure 2:
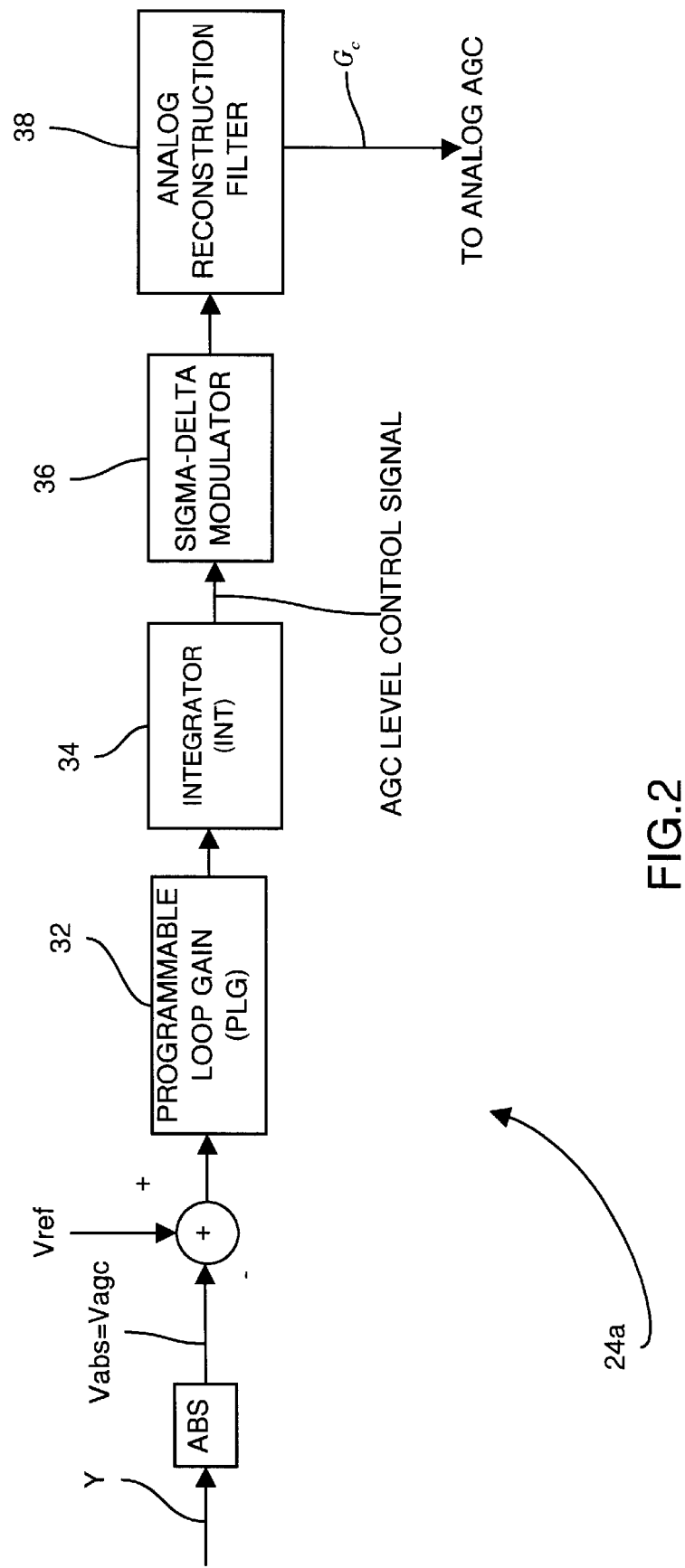
FIG. 2 illustrates a block diagram of a first AGC control signal circuit shown in FIG. 1 according to an embodiment of the present invention.

An AGC control signal circuit 24a according to a first embodiment of the present invention is illustrated in FIG. 2. An absolute value filter 30 receives as input the digital signal Y to produce an output signal Vabs, which in the present embodiment is also a Vagc signal.

The Vagc signal is subtracted from a reference/threshold Vref signal to obtain a delta signal (delta=Vref−Vagc). The delta signal is processed by a programmable loop gain (PLG) 32 characterised by the following scaling factor equation:

$$2^{-k_1}$$

where $k_1$ represents a gain factor.

The loop gain 32 scales down the delta signal by a prescribed value to produce a signal x for use by an integrator (INT) 34. For example, for a 16QAM system the gain $k_1$ of scaling factor defined by Eq. 1 varies over a range of $k_1$=15 to 18. The values of $2^{-k_1}$ are approximately inversely proportional of time constants of the AGC loop circuit (characterised by analog AGC 14, ADC 16 and control circuit 24). Therefore, for large $k_1$ the AGC loop circuit is slow and is less noisy in steady state.

The scaled delta signal is used as a stimulus for the integrator 34. The INT 34 takes the form of an up/down counter with variable step size and is characterised by the following equation:

$$a(n)=b(n)+a(n-1)$$

where a represents input to the integrator, b represents output from the integrator (AGC level control signal), and n is a sample number (i.e. time).

The programmable loop gain 32 and the integrator 34 incorporate two main operating modes that can be programmably modified by the values of the controlling parameter $k_1$. For example, during initialization/start-up operation the PLG 32 has high gain $2^{-k_1}$ (i.e. small $k_1$), and during steady state operation the gain $2^{-k_1}$ is reduced (i.e. increase $k_1$) to minimize steady state noise introduced to the demodulator 10. In summary, the programmable loop gain 32 can be configured to provide fast acquisition time (with large gain ripple), and then after convergence, switch to a slow mode with small steady state gain ripple. The PLG 32 also supports a wide dynamic range.

The output of the integrator 34 is an agc level control signal that is converted into a single bit control signal by a sigma-delta modulator 36 known in the art. The 1-bit sigma-delta digital signal is output from the modulator 36 at a multiple of the ADC sampling rate and passed through an analog reconstruction filter 38 to produce the control signal $G_c$. The control signal $G_c$ is used by the analog AGC 12 to control the gain of the input signal X as described above.

Figure 3:
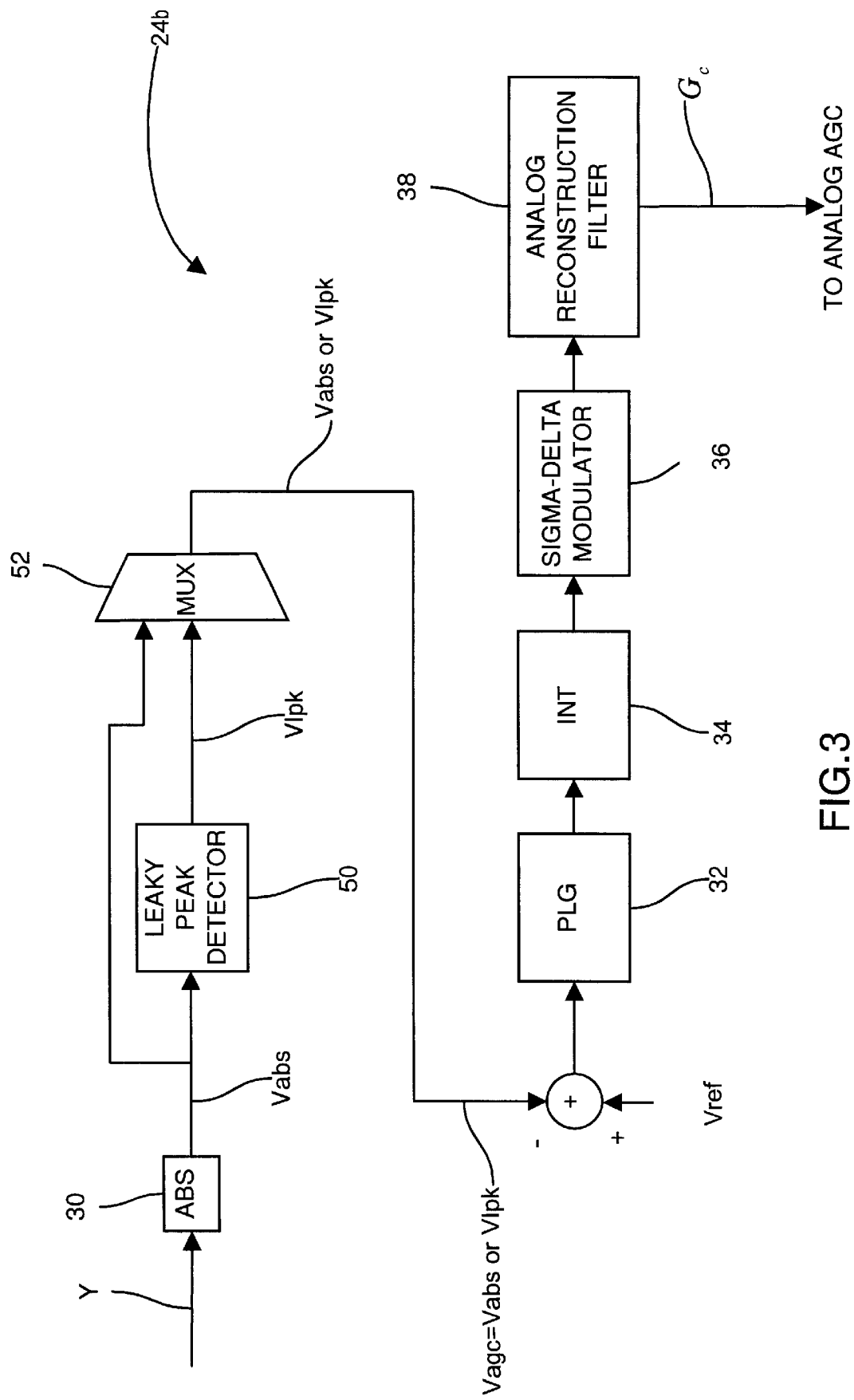
FIG. 3 illustrates a block diagram of a second AGC control signal circuit shown in FIG. 1 according to another embodiment of the present invention.

An AGC control signal circuit 24b according to a second embodiment of the present invention is illustrated in FIG. 3. In circuit 24b the Vabs signal is obtained taking the absolute value of the digital signal Y. The Vabs signal is processed by a leaky peak detector 50 to obtain a Vlpk signal which is then multiplexed with the Vabs signal by a multiplexer (MUX) 52 to obtain the Vagc signal. Therefore, the output from the MUX 52 (the Vagc signal) is either the Vabs signal, if the leaky peak detector 50 is bypassed, or the Vlpk signal. The Vagc signal that is then processed as discussed in conjunction with circuit 24a of FIG. 2 to produce the control signal $G_c$ for the analog AGC 14.

The peak detector 50 is used to detect a peak Px of the Vabs signal. The peak detector 50 incorporates a leak to ensure that a selected peak value tracks the level of the Vabs signal so that an originally estimated peak does not remain fixed at the same level. The detector 50 also reduces rapid fluctuations in the Vabs signal. The leaky peak calculation is characterised by the following equation:

$$Vlpk=Px-2^{-k}Px,$$

where Px is a selected peak and $2^{-k}$ is a leakage factor and is programmable over a range of k=4 to k=8.

The range of k allows control over leak speed (i.e. how quickly the detector 50 "forgets" the previous peak). The term "leak" refers to tracking the true peak of the Vabs signal, then allowing the peak to slowly reduce in time provided the following samples are smaller than the previous peak, otherwise a new peak will be declared and leaked.

Figure 4:
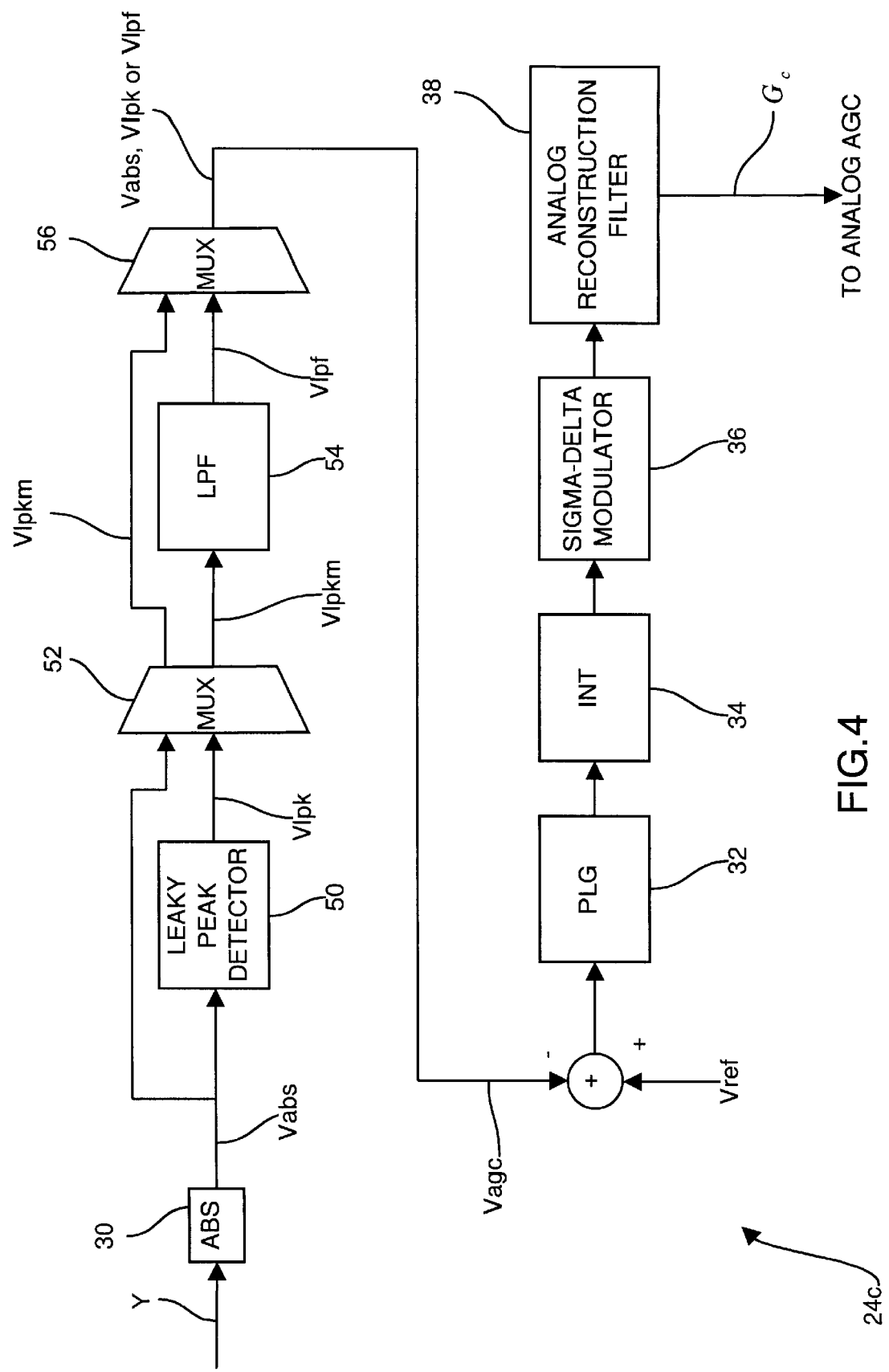
FIG. 4 illustrates a block diagram of a third AGC control signal circuit shown in FIG. 1 according to another embodiment of the present invention.

An AGC control signal circuit 24c according to a third embodiment of the present invention is illustrated in FIG. 4. The circuit 24c introduces a low pass filter 54 and a multiplexer 56 to the circuit 24b of FIG. 3. The low pass filter 54 is characterised by the following equation:

$$\frac{1}{1-(1-2^{k2})Z^{-1}}$$

where $k_2$ represents the pole of the filter and $Z^{-1}$ represents a phase shift In the circuit 24c the Vabs signal is processed by the leaky peak detector 50 to obtain the Vlpk signal which is then multiplexed with the Vabs signal by the multiplexer 52 to obtain a Vlpkm signal (i.e. Vlpkm is either Vabs or Vlpk).

The peak detector 50 is used to detect a peak x of the Vabs signal. The peak detector 50 incorporates a leak to ensure that the selected peak values track the agc level control signal, as discussed in conjunction with circuit 24b.

The Vlpkm signal is integrated by the low pass filter 54 to produce a Vlpf output signal that is multiplexed with the Vlpkm signal by the multiplexer 56 to produce the Vagc signal (i.e. Vagc is either (a) Vabs if detector 50 and LPF 54 are both bypassed, (b) Vlpk if Vabs is processed through detector 50, and LPF 54 is bypassed, or (c) Vlpf is Vabs processed through both the detector 50 and the LPF 54). The Vagc signal is then processed, as discussed in conjunction with circuit 24a of FIG. 2, to produce the control signal CS for the analog AGC 14.

In summary, the agc control signal circuits 24a–c provide the following features:

(a) multiple settings for the gain (by changing $k_1$) of the programmable loop gain 32 are supported that change for initialization/start-up and converged states to allow for faster initial acquisition/convergence with higher gains and low steady-state ripple with small gains.

(b) the addition of a leaky peak detector 50 (circuit 24b) provides the possibility of adjusting the signal level with respect to its peak rather than to its absolute average value.

(c) the addition of a low pass filter 54 with the leaky peak detector 50 (circuit 24c) provides an improved estimate of the signal level with respect to a threshold.

What is claimed is:

1. An automatic gain control circuit for a modem receiver, said receiver having an analog automatic gain control (AGC) amplifier to attenuate an input signal X prior to being digitized to a signal Y by an analog-to-digital converter, said automatic gain control circuit comprising:
   (a) means for obtaining an AGC signal from the signal Y;
   (b) means for subtracting the AGC signal from a prescribed reference signal to form a delta signal;
   (c) scaling means for reducing the delta signal by a prescribed value including a programmable loop gain characterized by $2^{-k_1}$, wherein $k_1$ represents a gain factor;
   (d) an up/down counter with variable step size for integrating the scaled delta signal to form an AGC level control signal; and
   (e) an analog reconstruction filter for converting the AGC level control signal to an analog AGC control signal for the analog AGC amplifier to attenuate the input signal X.

2. The circuit of claim 1, wherein the means for obtaining includes an absolute filter for receiving the signal Y and outputting the absolute value of the signal Y.

3. The circuit of claim 1, wherein the means for obtaining includes an absolute filter for receiving the signal Y and outputting the absolute value of the signal Y; and a leaky peak detector for adjusting the absolute value of the signal Y with respect to a peak of the absolute value of the signal Y.

4. The circuit of claim 3, wherein the leaky peak detector is characterised by:

$$Vlpk = Px - 2^{-k} Px,$$

where Vlpk is the adjusted absolute value of the signal Y, Px is a selected peak and $2^{-k}$ is a leakage factor.

5. The circuit of claim 4, wherein k is between 4 and 8.

6. The circuit of claim 1, wherein the means for obtaining includes an absolute filter for receiving the signal Y and outputting the absolute value of the signal Y; a leaky peak detector for adjusting the absolute value of the signal Y with respect to a peak of the absolute value of the signal Y; and a low pass filter for conditioning the adjusted absolute value of the signal Y from the leaky peak detector.

7. The circuit of claim 6, wherein the leaky peak detector is characterised by:

$$Vlpk = Px - 2^{-k} Px,$$

where Vlpk is the adjusted absolute value of the signal Y, Px is a selected peak and $2^{-k}$ is a leakage factor.

8. The circuit of claim 7, wherein k is between 4 and 8.

9. The circuit of claim 6, wherein the low pass filter is characterised by:

$$\frac{1}{1 - (1 - 2^{k2})Z^{-1}}$$

where $k_2$ represents the pole of the filter and $Z^{-1}$ represents a phase shift.

10. The circuit of claim 1, wherein $k_1$ is between 15 and 18.

11. The circuit of claim 1, wherein the integrator is characterized by:

$$a(n) = b(n) + a(n-1)$$

where a represents the scaled delta signal from the scaling means, b represents the AGC level control signal, and n is a sample number.

12. The circuit as claimed in claim 1 further including a sigma-delta modulator associated with the analog reconstruction filter.

13. An automatic gain control circuit for a modem receiver, said receiver having an analog automatic gain control (AGC) amplifier to attenuate an input signal X prior to being digitized to a signal Y by an analog-to-digital converter, said automatic gain control circuit comprising:
   a programmable loop gain for scaling down the signal Y to a first prescribed level using a first gain factor during a first mode of operation and to a second prescribed level using a second gain factor during a second mode of operation, the programmable loop gain being characterised by $2^{-k_1}$, wherein $k_1$ represents the gain factors;
   an up/down counter with variable step size for integrating the scaled down signal Y to form an AGC level control signal; and
   an analog reconstruction filter for converting the scaled down signal Y into an analog gain control signal for input to the analog AGC.

14. The circuit of claim 13, wherein $k_1$ is small to scale the signal Y to the first prescribed level during the first mode of operation, and wherein $k_1$ is increased to scale the signal Y to the second prescribed level during the second mode of operation.

15. A method of attenuating an input signal X in an automatic gain control circuit of a modem receiver, said receiver having an analog automatic gain control (AGC) amplifier to attenuate the input signal X prior to being digitized to a signal Y by an analog-to-digital converter, the method comprising the steps of:
   (a) scaling the signal Y to a first prescribed level using a first gain factor during a first mode of operation and to a second prescribed level using a second gain factor during a second mode of operation, using a programmable loop gain characterized by $2^{-k_1}$, wherein $k_1$ represents the first and second gain factors;
   (b) integrating the scaled signal Y using an up/down counter with variable step size to produce an AGC level control signal; and
   (c) converting the AGC level control signal into an analog gain control signal for input to the analog AGC using an analog reconstruction filter.

16. The method of claim 15, wherein $k_1$ is small to scale the signal Y to the first prescribed level during the first mode of operation, and wherein $k_1$ is increased to scale the signal Y to the second prescribed level during the second mode of operation.

17. The method of claim 16, wherein $k_1$ is approximately equal to 15 during the first mode of operation characterized by an initialization mode of operation and $k_1$ is increased to approximately 18 during the second mode of operation characterized by a steady state mode of operation.

* * * * *

UNITED STATES PATENT AND TRADEMARK OFFICE
CERTIFICATE OF CORRECTION

PATENT NO.    : 6,289,044 B1
DATED         : June 5, 2001
INVENTOR(S)   : Ernst A. Munter et al.

It is certified that error appears in the above-identified patent and that said Letters Patent is hereby corrected as shown below:

Column 1,
Line 36, "a" is corrected to -- an --; and "an" is corrected to -- a --;

Column 2,
Line 59, "G" is corrected to -- $G_C$ --;

Column 4,
Line 53, "agc" is corrected to -- AGC --; and

Column 5,
Line 11, "including" is corrected to -- using --.

Signed and Sealed this

Twelfth Day of March, 2002

Attest:

JAMES E. ROGAN
Attesting Officer    Director of the United States Patent and Trademark Office